United States Patent
Gregori et al.

(10) Patent No.: US 6,788,579 B2
(45) Date of Patent: Sep. 7, 2004

(54) METHOD FOR PROGRAMMING NONVOLATILE MEMORY CELLS WITH PROGRAM AND VERIFY ALGORITHM USING A STAIRCASE VOLTAGE WITH VARYING STEP AMPLITUDE

(75) Inventors: Stefano Gregori, Torre D'Isola (IT); Rino Micheloni, Turate (IT); Andrea Pierin, Graffignana (IT); Osama Khouri, Milan (IT); Guido Torelli, Sant'Alessio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 51 days.

(21) Appl. No.: 10/119,523

(22) Filed: Apr. 9, 2002

(65) Prior Publication Data

US 2002/0191444 A1 Dec. 19, 2002

(30) Foreign Application Priority Data

Apr. 10, 2001 (EP) .............................................. 01830247

(51) Int. Cl.⁷ ............................................. G11C 16/04
(52) U.S. Cl. .............................. 365/185.19; 365/185.2; 365/185.22; 365/185.24; 365/189.09; 365/226
(58) Field of Search ........................ 365/185.19, 185.2, 365/185.22, 185.24, 189.09, 226

(56) References Cited

U.S. PATENT DOCUMENTS

| | | | |
|---|---|---|---|
| 4,357,685 A | 11/1982 | Daniele et al. | 365/189 |
| 4,628,487 A | 12/1986 | Smayling | 365/185 |
| 5,257,224 A | 10/1993 | Nojiri et al. | 365/185 |
| 5,258,949 A | 11/1993 | Chang et al. | 365/185 |
| 5,774,397 A | 6/1998 | Endoh et al. | 365/185.19 |
| 5,812,457 A | 9/1998 | Arase | 365/185.22 |
| 5,880,993 A * | 3/1999 | Kramer et al. | 365/185.22 |
| 5,949,666 A | 9/1999 | Daniele et al. | 363/43 |
| 6,034,895 A | 3/2000 | Naura et al. | 365/189.19 |
| 6,278,634 B1 * | 8/2001 | Ra | 365/185.2 |
| 6,380,789 B1 * | 4/2002 | Baschirotto et al. | 327/336 |
| 6,392,931 B1 * | 5/2002 | Pasotti et al. | 365/185.19 |

FOREIGN PATENT DOCUMENTS

DE 100 34 743 A1 2/2001

OTHER PUBLICATIONS

Torelli, G. et al., "An Improved Method for Programming a Word–Erasable EEPROM," Alta Frequenza, LII(6):487–494, Nov.–Dec. 1983.

(List continued on next page.)

Primary Examiner—Richard Elms
Assistant Examiner—Pho M. Luu
(74) Attorney, Agent, or Firm—Lisa K. Jorgenson; Harold H. Bennett, II; Seed IP Law Group PLLC

(57) ABSTRACT

A method for programming a nonvolatile memory cell envisages applying in succession, to the gate terminal of the memory cell, a first and a second programming pulse trains with pulse amplitude increasing in staircase fashion, in which the amplitude increment between one pulse and the next in the first programming pulse train is greater than the amplitude increment between one pulse and the next in the second programming pulse train. The programming method envisages applying, to the gate terminal of the memory cell and before the first programming pulse train, a third programming pulse train with pulse amplitude increasing in staircase fashion, in which the amplitude increment between one pulse and the next may be less than the amplitude increment in the first programming pulse train and substantially equal to the amplitude increment in the second programming pulse train, or else may be greater than the amplitude increment in the first programming pulse train.

33 Claims, 9 Drawing Sheets

OTHER PUBLICATIONS

Calligaro, C. et al., "Technological and Design Constraints for Multilevel Flash Memories," in *Proceedings of Third IEEE Int. Conf. On electronics, Circuits and Systems (ICECS)*, Oct. 1996, pp. 1005–1008.

Jung, T. et al., "A 117–mm$^2$ 3.3–V Only 128–Mb Multilevel NAND Flash Memory for Mass Storage Applications," *IEEE Journal of Solid–State Circuits,* 31(11):1575–1583, Nov. 1996.

Riccò, et al., "Nonvolatile Multilevel Memories for Digital Applications," *Proceedings of the IEEE,* 86(12):2399–2421, Dec. 1998.

* cited by examiner

| Pulse No. | Error on threshold voltage variation $\Delta V_t$ |
|---|---|
| n + 1 | $(1 - \gamma)(\Delta V_{G1} - \Delta V_{G2})/\Delta V_{G2}$ |
| n + 2 | $(1 - \gamma)^2(\Delta V_{G1} - \Delta V_{G2})/\Delta V_{G2}$ |
| n + 3 | $(1 - \gamma)^3(\Delta V_{G1} - \Delta V_{G2})/\Delta V_{G2}$ |
| n + 4 | $(1 - \gamma)^4(\Delta V_{G1} - \Delta V_{G2})/\Delta V_{G2}$ |
| n + 5 | $(1 - \gamma)^5(\Delta V_{G1} - \Delta V_{G2})/\Delta V_{G2}$ |
| ⋮ | ⋮ |
| n + i | $(1 - \gamma)^i(\Delta V_{G1} - \Delta V_{G2})/\Delta V_{G2}$ |
| ⋮ | ⋮ |

Table I

Fig. 7

| Pulse No. | $\Delta V_G$ [mV] | Threshold voltage variation $\Delta V_T$ | | | |
|---|---|---|---|---|---|
| | | $\gamma = 0.6$ | $\gamma = 0.7$ | $\gamma = 0.8$ | $\gamma = 0.9$ |
| N | 400.000 | 400.000 | 400.000 | 400.000 | 400.000 |
| n + 1 | 100.000 | 220.000 | 190.000 | 160.000 | 130.000 |
| n + 2 | 100.000 | 148.000 | 127.000 | 112.000 | 103.000 |
| n + 3 | 100.000 | 119.200 | 108.100 | 102.400 | 100.300 |
| n + 4 | 100.000 | 107.680 | 102.430 | 100.480 | 100.030 |
| n + 5 | 100.000 | 103.072 | 100.729 | 100.096 | 100.003 |
| n + 6 | 100.000 | 101.229 | 100.219 | 100.019 | 100.000 |
| n + 7 | 100.000 | 100.492 | 100.066 | 100.004 | 100.000 |
| n + 8 | 100.000 | 100.197 | 100.020 | 100.001 | 100.000 |
| n + 9 | 100.000 | 100.079 | 100.006 | 100.000 | 100.000 |
| n + 10 | 100.000 | 100.031 | 100.002 | 100.000 | 100.000 |

Table II

*Fig. 8*

| Pulse No. | Percentage error on threshold voltage variation $\Delta V_T$ | | | |
|---|---|---|---|---|
| | $\gamma = 0.6$ | $\gamma = 0.7$ | $\gamma = 0.8$ | $\gamma = 0.9$ |
| n + 1 | 120.000000 | 90.000000 | 60.000000 | 30.000000 |
| n + 2 | 48.000000 | 27.000000 | 12.000000 | 3.000000 |
| n + 3 | 19.200000 | 8.100000 | 2.400000 | 0.300000 |
| n + 4 | 7.680000 | 2.430000 | 0.480000 | 0.030000 |
| n + 5 | 3.072000 | 0.729000 | 0.096000 | 0.003000 |
| n + 6 | 1.228800 | 0.218700 | 0.019200 | 0.000300 |
| n + 7 | 0.491520 | 0.065610 | 0.003840 | 0.000030 |
| n + 8 | 0.196608 | 0.019683 | 0.000768 | 0.000003 |
| n + 9 | 0.078643 | 0.005905 | 0.000154 | 0.000000 |
| n + 10 | 0.031457 | 0.001771 | 0.000031 | 0.000000 |

Table III

*Fig. 9*

METHOD FOR PROGRAMMING NONVOLATILE MEMORY CELLS WITH PROGRAM AND VERIFY ALGORITHM USING A STAIRCASE VOLTAGE WITH VARYING STEP AMPLITUDE

BACKGROUND OF THE INVENTION

1. Field of the Invention

The present invention relates to a method for programming nonvolatile memory cells with a program and verify algorithm in which the amplitude of the programming pulses increases in staircase fashion with a variable slope.

2. Description of the Related Art

As is known, the most widely used programming methods for nonvolatile memory cells are based upon program and verify algorithms. This approach can be applied both to programming by injection of hot electrons from the channel and to programming via Fowler-Nordheim tunnelling, and is particularly indicated whenever a high programming precision is required, as in the case of multilevel storage.

Programming of a nonvolatile memory cell is normally performed by means of a sequence of programming steps interspersed with verification steps in which the state of the memory cell is verified. In this connection, see, for example, G. Torelli, P. Lupi, "An Improved Method for Programming a Word-erasable EEPROM," *Alta Frequenza,* Vol. LII, n. 6, November/December 1983, pp. 487–494.

In particular, during the programming steps a programming voltage is applied to the gate terminal of the memory cell, the amplitude of which is increased by a constant amount at each programming step, and the sequence is continued until the threshold voltage of the memory cell, which was initially at a low value, reaches the desired value.

In order for the programmed level of the threshold voltage to be increased by the same amount at each step, with a constant temporal duration for the programming steps, it is necessary to apply increasingly higher programming voltages to the gate terminal of the memory cell being programmed. If at each programming step the voltage $V_G$ on the gate terminal is increased by a constant amount $\Delta V_G = V_{G,(i+1)} - V_{G,i}$ (where i designates a generic programming step) and if the temporal duration of the programming phase at each individual step is sufficient, in steady-state conditions a constant increment $\Delta V_T = V_{T,(i+1)} - V_{T,i}$ is obtained of the threshold voltage for each programming step.

In this connection, see, for example, C. Calligaro, A. Manstretta, P. Rolandi, G. Torelli, "Technological and Design Constraints for Multilevel Flash Memories," *Proc. 3rd IEEE Int. Conf. on Electronics, Circuits and Systems (ICECS),* October 1996, pp. 1005–1008, and T. S. Jung, et al., "A 17-mm2 3.3 V Only 128-Mb Multilevel NAND Flash Memory for Mass Storage Applications," *IEEE J. Solid-State Circuits,* vol. 31, No. 11, 1996, pp. 1575–1583, in which programming methods are described for programming multilevel memories with a pulsed voltage, the amplitude of which increases in staircase fashion with a constant slope, i.e., in which the programming voltage is constituted by a succession of programming pulses where the voltage difference between one pulse and the preceding one is constant.

FIG. 1 shows a graph presented in the above-mentioned paper "Technological and Design Constraints for Multilevel Flash Memories" and representing the linear relationship existing between the threshold voltage of a memory cell and the programming voltage applied to the gate terminal of the memory cell, when said programming voltage presents a pulsed pattern the amplitude of which increases in staircase fashion.

In particular, FIG. 1 shows various programming curves obtained with $\Delta V_G = 500$ mV, in which appearing on the top horizontal axis is the voltage $V_G$ applied to the gate terminal of a memory cell, on the bottom horizontal axis is the number of steps, and on the vertical axis is the overall threshold-voltage variation starting from a pre-set initial value (in FIG. 1, $\Delta V_T$ designates the overall threshold-voltage variation, whereas in the present text $\Delta V_T$ designates the threshold-voltage variation obtained with a single programming pulse).

When a program and verify algorithm is used, the amplitude of the programmed threshold voltage distributions depends upon the variation of the threshold voltage $\Delta V_T$ obtained at each step. In particular, the programming precision, i.e., the maximum difference between the threshold-voltage value actually obtained and the desired nominal value, depends upon $\Delta V_T$. For practical purposes, therefore, the programming precision depends upon $A V_G$, i.e., upon the increment of the programming voltage at each programming step.

In order to obtain a high programming precision, which is indispensable in multilevel digital storage, it is thus necessary to reduce $\Delta V_G$ as much as possible. In this connection, see, for example, B. Riccò, et al., "Nonvolatile Multilevel Memories for Digital Applications," *Proceedings of the IEEE,* Vol. 86, No. 12, December 1998, pp. 2399–2421.

Obviously, the higher the number of bits that are to be stored in the individual memory cell, the greater is the programming precision required. If the same range of programmable threshold voltages is available, given the same technological generation, in order to increase by one bit the information content storable in a single cell, it is necessary at least to double the programming precision. For practical purposes, even when the programming precision is doubled, the noise margin between two adjacent distributions of programmed threshold voltages is halved, and hence the programming precision must be further increased in order to obtain an acceptable level of reliability.

FIG. 2 is a qualitative representation of the distributions of programmed threshold voltages for multilevel cells with 2-bit per cell, using a technology currently available in which the range of programmable threshold voltages is fixed between 1 V and 6 V. Also represented in FIG. 2 are the distributions of threshold voltages that may be obtained in the same voltage range for multilevel cells with 4-bit per cell. Likewise represented in FIG. 2, as hatched areas, are the corresponding noise margins.

In this case, even supposing that it is possible to reduce the noise margins by a factor of four, the width of the programmed threshold voltage distributions must be reduced by at least a factor of four.

Reduction in $\Delta V_G$ in order to increase programming precision determines an increase in programming times. To obtain the same overall threshold voltage variation, using programming steps having the same temporal duration, with $\Delta V_G$ halved, twice as much time is required. Returning to the previous example, given the same technology, 4-bit-per-cell programming, as compared to 2-bit-per-cell programming, requires at least four times as long. For this reason, the increase in programming times may prove a limit for the development of multilevel memories with a high number of bits per cell.

In order to reduce the programming time, then, programming methods have been proposed for programming nonvolatile memories with staircase programming voltages, where the amplitude of the steps is not constant, but rather varies according to different modalities.

For example, the U.S. patents U.S. Pat. No. 4,357,685 "Method of Programming an Electrically Alterable Nonvolatile Memory", and U.S. Pat. No. 5,812,457 "Semiconductor NAND Type Flash Memory with Incremental Step Pulse Programming" describe methods for programming non-multilevel memories, in which the programming voltage is formed by a succession of programming pulses having increasing amplitude or duration, whilst the U.S. Pat. No. 5,257,255 "Method for Programming Programmable Devices by Utilizing Single or Multiple Pulses Varying in Pulse Width and Amplitude" describes a programming method that uses single or multiple pulses having varying amplitude or duration, in which a first train of programming pulses is applied to an electrode of the programmable device and, simultaneously, a second train of programming pulses is applied to a second electrode of the programmable device.

Although the programming methods using staircase programming voltages with varying incremental amplitude between adjacent programming steps described in the aforementioned patents enable a reduction in the time for programming nonvolatile memories as compared to programming methods using staircase programming voltages in which the increment in amplitude between adjacent programming steps (i.e., between one programming step and the next) is constant, they currently form the subject of continuous study and research in so far as the effective reduction in the programming time that they make possible is not yet altogether satisfactory.

BRIEF SUMMARY OF THE INVENTION

An embodiment of the present invention provides a method for programming nonvolatile memory cells with a staircase programming voltage having varying incremental amplitude between adjacent programming steps, the said method being based on a program and verify algorithm that enables a further reduction in the time required for high-precision programming as compared to conventional programming methods.

According to an embodiment of the present invention, a method for programming a memory cell based upon a program and verify algorithm is provided The method for programming a nonvolatile memory cell envisages applying in succession, to the gate terminal of the memory cell, a first and a second programming pulse trains with pulse amplitude increasing in staircase fashion, in which the amplitude increment between one pulse and the next in the first programming pulse train is greater than the amplitude increment between one pulse and the next in the second programming pulse train. The programming method envisages applying, to the gate terminal of the memory cell and before the first programming pulse train, a third programming pulse train with pulse amplitude increasing in staircase fashion, in which the amplitude increment between one pulse and the next may be less than the amplitude increment in the first programming pulse train and substantially equal to the amplitude increment in the second programming pulse train, or else may be greater than the amplitude increment in the first programming pulse train.

BRIEF DESCRIPTION OF THE SEVERAL VIEWS OF THE DRAWING(S)

For a better understanding of the present invention, some embodiments thereof are now described, purely by way of non-limiting example, with reference to the attached drawings, in which.

Figure 11:
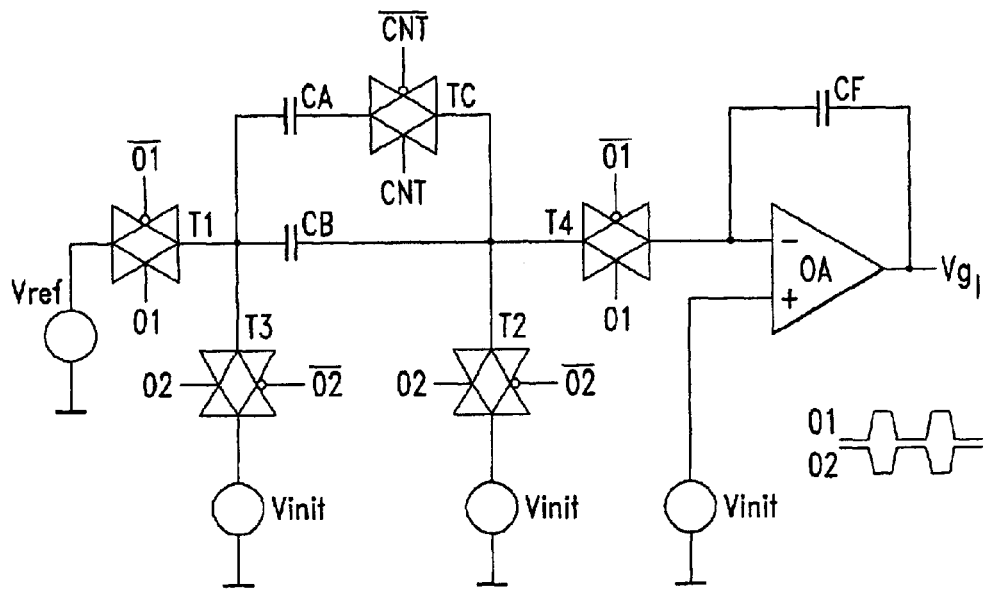
Figure 12:
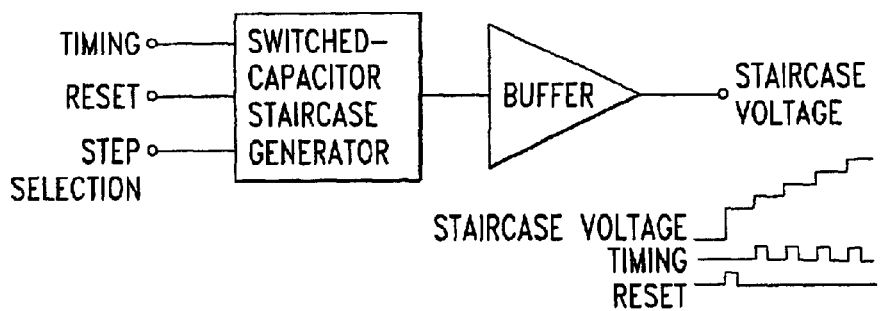
Figure 10A:
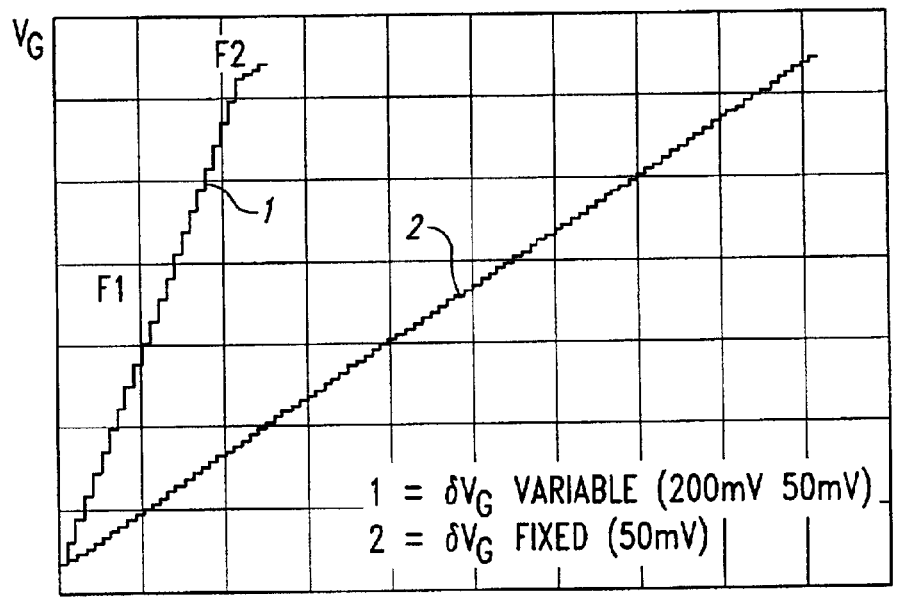
Figure 10B:
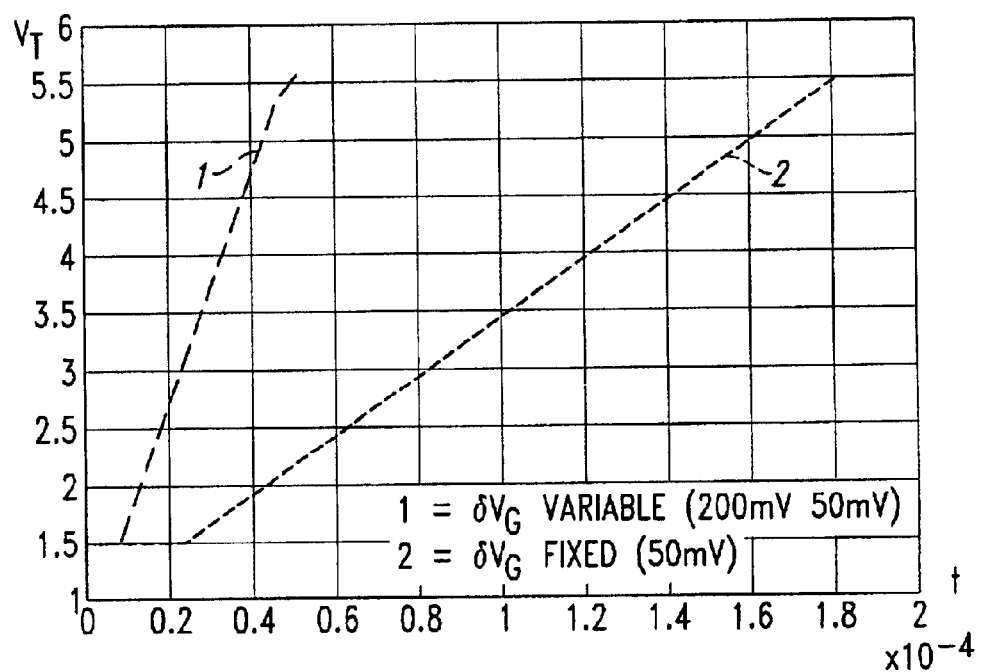

FIGS. 7, 8, and 9 are tables referring to the programming method according to the present invention;

FIGS. 10a and 10b show, respectively, a plot as a function of time of the programming voltage applied to the gate terminal of a memory cell with voltage increment between adjacent steps that assumes two possible values, and a plot as a function of time of the corresponding programmed threshold voltage;

FIG. 11 shows the a switched-capacitor circuit for the generation of a varying incremental staircase voltage; and FIG. 12 shows the block diagram of a circuit for the generation of the staircase programming voltage with varying increments between adjacent steps.

DETAILED DESCRIPTION OF THE INVENTION

Figure 1:
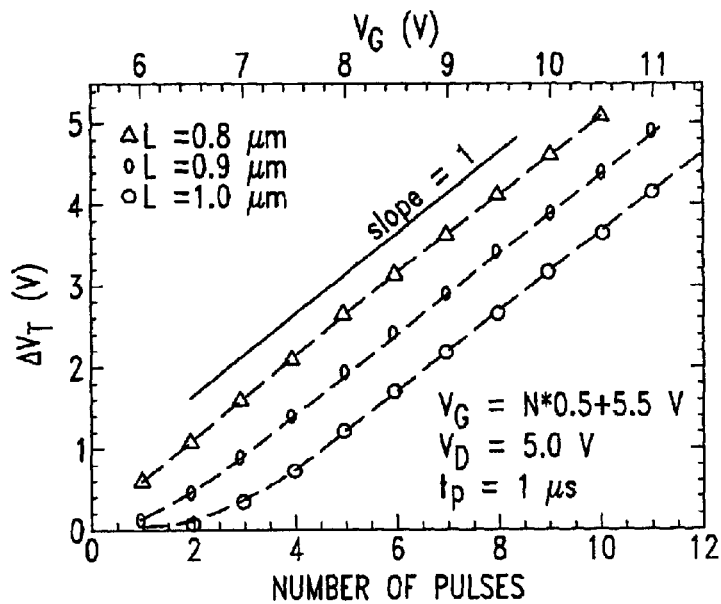
FIG. 1 shows a graph representing the linear relationship existing between the threshold voltage of a memory cell and the programming voltage applied to the gate terminal of the memory cell, when the programming voltage presents a staircase waveform.
Figure 2A:
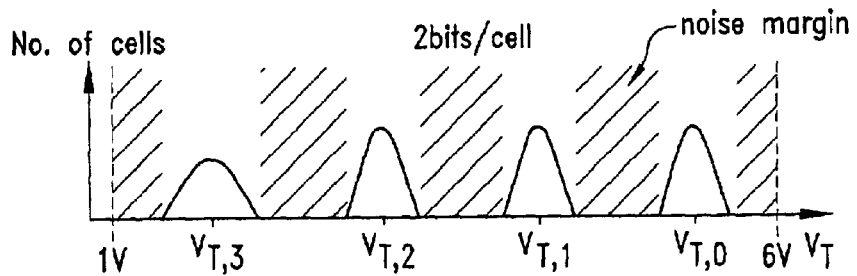
FIGS. 2a and 2b are representations of the programmed threshold voltage distributions for multilevel cells with 2-bit per cell and, respectively, 4-bit per cell, and of the corresponding noise margins.
Figure 2B:
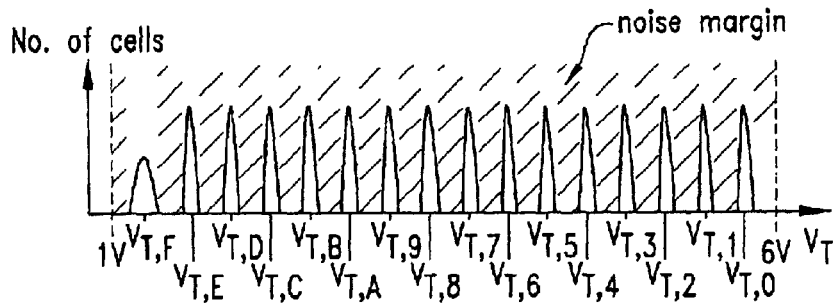
Figure 3:
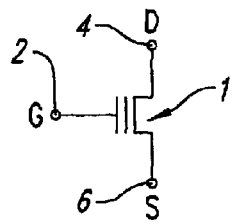
FIG. 3 is a schematic representation of a nonvolatile memory cell.

FIG. 3 shows a nonvolatile memory cell 1 to be programmed that forms part of a nonvolatile memory device, in which the gate terminal is designated by 2, the drain terminal by 4, and the source terminal by 6.

In particular, as is known, in a nonvolatile memory device the gate terminal 2 of a memory cell is connected to an array row (not shown) selectable by means of a row decoder (not shown), the drain terminal 4 is connected to an array column (not shown) selectable by means of a column decoder (not shown), whilst the source terminal 6 is connected to a common line (not shown).

The inventive principle lying at the basis of the present invention will be described in what follows with reference to FIGS. 4, 5 and 6, which show the plots as a function of time of the programming voltage $V_G$ and of the voltage $V_D$ respectively applied to the gate terminal 2 and to the drain terminal 4 of the memory cell 1, in three different embodiments of the present invention.

Figure 4A:
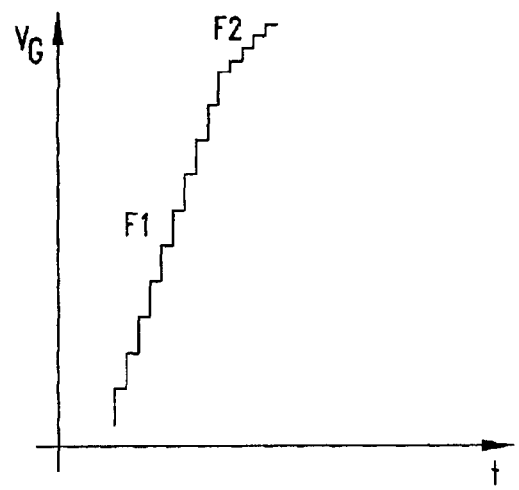
FIG. 4a shows, in a simplified and qualitative way, the plot as a function of time of the programming voltage applied to the gate terminal of the memory cell of FIG. 1 in a first embodiment of the present invention.

In particular, FIG. 4a shows the staircase waveform of the amplitude of the programming voltage $V_G$ applied to the gate terminal of the memory cell 1 in the first embodiment of the present invention.

Figure 4B:
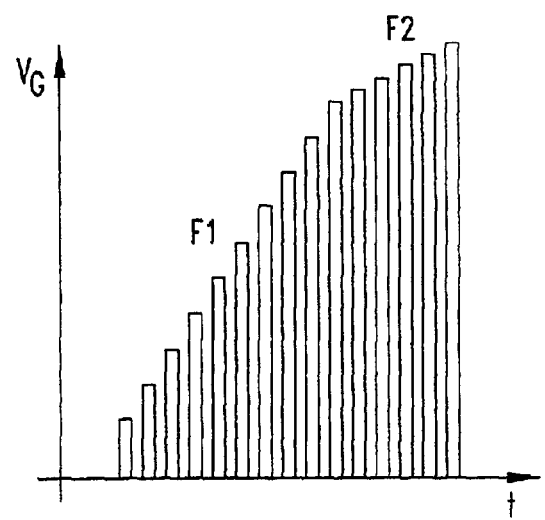
FIGS. 4b and 4c are the effective plots as a function of time of the voltages applied to the gate terminal and, respectively, to the drain terminal of the memory cell of FIG. 1 in the first embodiment of the present invention.

In actual fact, the staircase programming voltage $V_G$ is not formed by a series of voltage steps succeeding one another in time, but rather of a series of voltage pulses of progressively increasing amplitude succeeding one another in time, as shown in FIG. 4b.

Figure 4C:
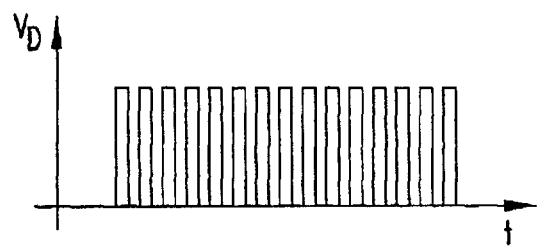

FIG. 4c is instead the plot as a function of time of the voltage $V_D$ applied to the drain terminal 4 of the memory cell 1, again in the first embodiment of the present invention.

In particular, as shown in FIGS. 4a–4c, the first embodiment of the invention envisages programming of the memory cell 1 in two phases.

In the first phase, designated in the figure by F1, to the drain terminal 4 and to the gate terminal 2 of the memory cell 1 to be programmed there is applied a first pair of programming (voltage) pulse trains; namely, one programming pulse train of the pair is applied to the drain terminal 4, and the other to the gate terminal 2. The programming pulses applied to the drain terminal 4 ($V_D$) have a constant amplitude, for example of between 4 V and 5 V, whereas the programming pulses applied to the gate terminal 2 ($V_G$) have an increasing amplitude, in such a way that the voltage difference between one programming pulse and the preceding one, i.e., the voltage increment between adjacent pulses $\Delta V_{G1}$, is constant and has a high value, in particular higher than the precision desired for the programmed threshold voltage, for example a value of between 200 mV and 600 mV.

In the second phase, instead, designated in the figure by F2, to the drain terminal 4 and to the gate terminal 2 of the memory cell 1 to be programmed there is applied a second pair of programming pulse trains; namely, one programming pulse train of the pair is applied to the drain terminal 4, and the other to the gate terminal 2. The programming pulses applied to the drain terminal 4 ($V_D$) again have a constant amplitude, preferably equal to the one in the first phase F1, whereas the programming pulses applied to the gate terminal 2 ($V_G$) have an increasing amplitude, in such a way that the voltage difference between one programming pulse and the preceding one, i.e., the voltage increment between adjacent pulses $\Delta V_{G2}$, is again constant but has a value lower than $\Delta V_{G1}$ and is of the same order of precision as that desired for the threshold voltage programmed, for example between 50 mV and 100 mV.

In addition, the first programming pulse of the second programming pulse train applied to the gate terminal 2 of the memory cell 1 in the second phase F2 has an amplitude equal to that of the last programming pulse of the first programming pulse train applied to the gate terminal 2 in the first phase F1 increased by a quantity $\Delta V_{G2}$.

Furthermore, transition from the first phase F1 to the second phase F2 takes place after the threshold voltage $V_T$ of the memory cell 1 has exceeded a pre-set reference value $V_{TR1}$, appropriately chosen below the value of the threshold voltage at which the memory cell 1 is to be programmed.

Figure 5A:
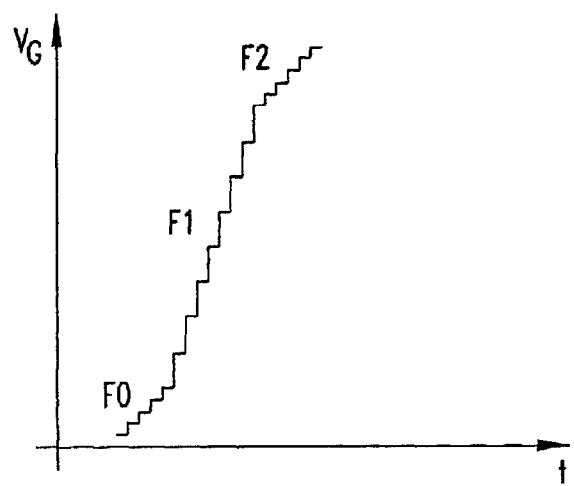
FIG. 5a shows, in a simplified and qualitative way, the plot as a function of time of the programming voltage applied to the gate terminal of the memory cell of FIG. 1 in a second embodiment of the present invention.
Figure 5B:
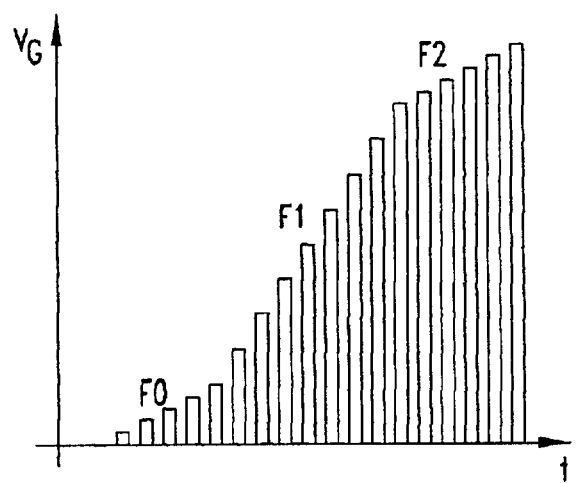
FIGS. 5b and 5c are the effective plots as a function of time of the voltages applied to the gate terminal and, respectively, to the drain terminal of the memory cell of FIG. 1 in the second embodiment of the present invention.
Figure 5C:
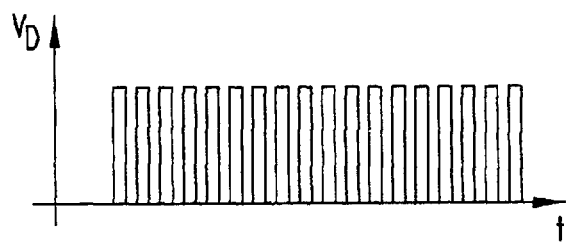

FIGS. 5a, 5b and 5c are similar to FIGS. 4a, 4b and 4c and show the plots as a function of time of the programming voltage $V_G$ and of the voltage $V_D$ respectively applied to the gate terminal 2 and to the drain terminal 4 of the memory cell 1 in the second embodiment of the present invention.

In particular, as shown in FIGS. 5a–5c, the second embodiment of the present invention envisages programming of the memory cell 1 in three phases.

In the first phase, designated in the figure by F0, to the drain terminal 4 and to the gate terminal 2 of the memory cell 1 to be programmed there is applied a first pair of programming pulse trains; namely, one programming pulse train of the pair is applied to the drain terminal 4, and the other to the gate terminal 2. The programming pulses applied to the drain terminal 4 have a constant amplitude, for example preferably equal to the one applied in the phases F1 and F2 of the first embodiment, whereas the programming pulses applied to the gate terminal 2 have an increasing amplitude, in such a way that the voltage difference between one programming pulse and the preceding one, ie., the voltage increment between adjacent pulses $\Delta V_{G0}$, is constant and has a limited value, for example of the same order as that of the precision desired for the programmed threshold voltage.

In the first phase F0, the memory cells with different starting threshold voltages or with different characteristics due to the process spreads are substantially brought back to the same conditions.

The two subsequent phases are the same as the phases F1 and F2 of the first embodiment, and consequently will not be described again.

It is only emphasized that $\Delta V_{G0}$ may also be equal to $\Delta V_{G2}$, and that the first pulse of the second phase (phase F1) has an amplitude equal to that of the last pulse of the first phase (phase F0) increased by a quantity $\Delta V_{G1}$.

Transition from the first phase F0 to the second phase F1 can take place after a fixed number of pulses, or else after the threshold voltage $V_T$ of the memory cell 1 has exceeded an appropriately chosen pre-set reference value $V_{TR0}$.

Transition from the second phase F1 to the third phase F2 takes place in a way identical to what was described for the first embodiment.

Figure 6A:
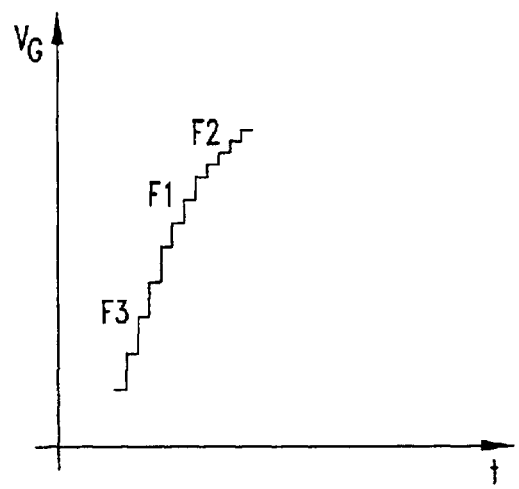
FIG. 6a shows, in a simplified and qualitative way, the plot as a function of time of the programming voltage applied to the gate terminal of the memory cell of FIG. 1 in a third embodiment of the present invention.
Figure 6B:
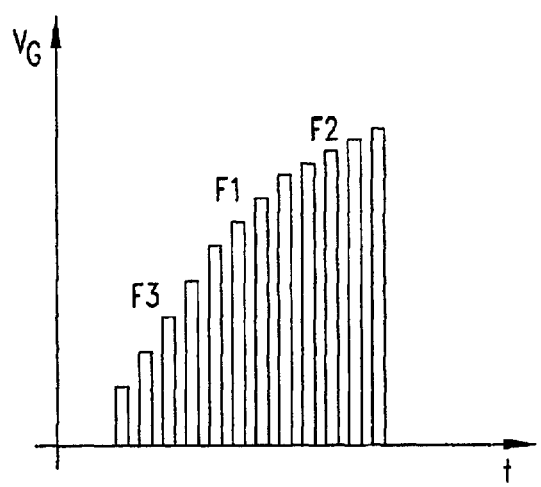
FIGS. 6b and 6c are the effective plots as a function of time of the voltages applied to the gate terminal and, respectively, to the drain terminal of the memory cell of FIG. 1 in the third embodiment of the present invention.
Figure 6C:
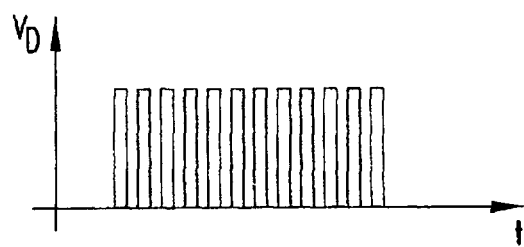

FIGS. 6a, 6b and 6c are similar to FIGS. 4a, 4b and 4c and show the plots as a function of time of the programming voltage $V_G$ and of the voltage $V_D$ respectively applied to the gate terminal 2 and to the drain terminal 4 of the memory cell 1 in a third embodiment of the present invention.

In particular, as shown in FIGS. 6a–6c, the third embodiment of the present invention represents one of the possible variants of the second embodiment and differs from the latter in that the first programming pulse train applied to the gate terminal 2 of the memory cell 1, designated in the figure by F3, presents a voltage increment between adjacent pulses greater than the one present in the programming pulse train applied to the gate terminal 2 in the second phase F1.

In other words, the third embodiment envisages that programming of the memory cell 1 takes place always in three phases, but that a phase F1 is used with a voltage increment between adjacent pulses that is intermediate between the initial phase F3, in which said increment is greater, and the end phase F2, in which said increment is smaller.

In addition, it is also possible to use a series of intermediate phases with a voltage increment between adjacent pulses that is progressively decreasing in amount so as to obtain the most satisfactory compromise between programming precision and programming time.

From what has been described above it is evident that, unlike what is proposed in the documents of the prior art, and in particular in the U.S. Pat. No. 5,257,255, the present invention proposes a method in which programming of a memory cell is performed by means of application, to a first terminal of the memory cell, namely the gate terminal in the case of memories programmed by injection of channel hot electrons, of at least two distinct successive trains of voltage pulses having precise characteristics, where each train presents pulses in which the voltage is incremented by a given constant value between one pulse and the next, and the value of this increment is different for the different pulse trains, whilst to a second terminal of the memory cell, namely the drain terminal in the case of memory cells programmed by injection of channel hot electrons, there are applied pulse trains having a substantially constant amplitude simultaneously with the pulse trains applied to the gate terminal which have been described previously.

Transition from one pulse train to another (with the possible exclusion of the transition from phase F0 to phase F1 in the second embodiment) does not follow any pre-defined procedure, but takes place according to the result of the verify operation, which is performed at each programming step by using appropriate references.

The advantages that may be achieved with the programming methods according to the present invention in terms of memory cell programming speed will emerge clearly from what follows.

Suppose that during a programming pulse with constant drain, source and substrate voltages, the gate current $I_G$ is an increasing function of $V_G - V_T$:

$$I_G = f(V_G - V_T) \tag{1}$$

The gate current $I_G$ is linked to the charge $Q_{FG}$ stored in the floating gate, and hence to the threshold voltage $V_T$, by the following relation:

$$I_G = -\frac{dQ_{FG}}{dt} = C_G \frac{dV_T}{dt} \tag{2}$$

where $C_G$ is the capacitance between the floating gate and the control gate.

The differential relation that governs the variation of the threshold voltage $V_T$ during a programming pulse is then:

$$\frac{dV_T}{dt} = \frac{f(V_G - V_T)}{C_G} \tag{3}$$

It may be noted that as the threshold voltage $V_T$ increases there is a decrease in its time derivative $dV_T/dt$.

Suppose that a gate voltage $V_G$ higher than the initial threshold voltage of the memory cell is applied, such that injection of hot electrons from the channel into the floating gate is triggered. The variation in the threshold voltage obtained in a programming step depends upon the initial difference between the voltages $V_{G,applied} - V_{T,initial} - V_D$, where $V_D$ is a constant that depends upon the biasing conditions and physical characteristics of the memory cell. More precisely, if the programming pulse had an infinite duration, the variation in the threshold voltage would be equal to the value indicated. On account of the non-complete disappearance of the transient during a programming pulse, the threshold-voltage variation actually obtained is a fraction γ of the initial difference between the voltage $V_{G,applied} - V_{T,initial} - V_D$.

If a simplified model with a single time constant is used, γ depends only upon the duration of the programming pulse, the biasing voltages, and the physical characteristics of the memory cell. Consequently, if programming pulses having a constant duration are considered, γ is a constant.

If a program and verify algorithm is used with pulsed gate programming voltage with incremental staircase voltage amplitude having constant increments between adjacent pulses (as pointed out previously, with this technique at each programming pulse the gate voltage is increased by a constant quantity $\Delta V_G$ with respect to the value reached at the preceding pulse), the threshold voltage at the end of the i-th programming pulse is then given by the following relation:

$$V_{T,i} = V_{T,i-1} + \gamma(V_{G,i} - V_{T,i} - V_D) \tag{4}$$

Introducing the difference between the gate voltage and the threshold voltage at the end of the pulse:

$$X_i = V_{G,i} - V_{T,i} \tag{5}$$

and, making the substitution:

$$V_{G,i} = V_{G,0} + i\Delta V_G \tag{6}$$

we obtain:

$$X_{i+1} - X_i = ((1-\gamma)\Delta V_G + \gamma V_D) - \gamma X_i \tag{7}$$

Equation (7) is a discrete-time differential equation of the first order, from which it is found that the steady-state value $(\Delta V_G(1-\gamma)/\gamma + V_D)$ is reached with a constant $1/\gamma$ over the number of programming steps.

For the present purposes, if the value of the increment $\Delta V_G$ is varied, for example if there is a transition from an increment $\Delta V_{G1}$ to an increment $\Delta V_{G2}$, adaptation on the corresponding threshold voltage variations obtained at each programming step takes place with a constant $1/\gamma$.

Suppose that after n programming steps with a programming voltage increment $\Delta V_{G1}$ between adjacent steps, in the course of which the threshold voltage variation at each pulse has reached the steady-state value, the programming voltage increment between adjacent steps is reduced to $\Delta V_{G2}$ (with $\Delta V_{G2} < \Delta V_{G1}$).

The error on the threshold voltage increment after i pulses starting from the n-th pulse is given by the following equation:

$$X_{n+i-1} - X_{n+i} = (1-\gamma)^i(\Delta V_{G1} - \Delta V_{G2}) \tag{8}$$

Table I of FIG. 7 gives the errors on the threshold voltage variation that is obtained after transition from an increment value $\Delta V_{G2}$ to a reduced increment value $\Delta V_{G1}$. More precisely, the table gives the errors found after the first pulse (n+1) with reduced $\Delta V_G$, after the second pulse (n+2), after the third pulse (n+3), and so forth.

Table II of FIG. 8, instead, gives the values of the threshold voltage variation ($\Delta V_T$) obtained in the transition from $\Delta V_{G1} = 400$ mV to $\Delta V_{G2} = 100$ mV, with different values of γ (γ=0.6; 0.7; 0.8; 0.9) for the first ten pulses after the variation. The n-th programming pulse is the last one where an increment $\Delta V_G = \Delta V_G = 400$ mV is applied, so that the corresponding threshold voltage variation $\Delta V_{G1}$ is still 400 mV. Starting from the next pulse (n+1), the increment applied is $\Delta V_G = \Delta V_{G2} = 100$ mV. The threshold voltage variation obtained in the course of the subsequent pulses converges towards the steady-state value (100 mV).

Finally, Table III of FIG. 9 gives the percentage errors on the threshold voltage variation that correspond to the previous example. It may be noted that the error, which is high at the first pulse, decreases rapidly in the subsequent pulses, whilst the threshold voltage variation converges to its steady-state value. For example, if $\gamma=0.8$, at the second pulse the error is already only 12% with respect to the increment $\Delta V_G$, whilst at the fourth pulse it is lower than 0.5%.

This demonstrates the possibility of reducing the programming voltage increment between adjacent programming steps, maintaining a high precision on the threshold voltage variation obtained. In particular, it is possible to pass from a phase (F1) of fast programming ($\Delta V_G$ high) to a phase (F2) of fine programming ($\Delta V_G$ reduced), obtaining an excellent correspondence between programming voltage increment and threshold voltage variation in a limited number of pulses after the transition.

An example of the programming curves that may be obtained using the present invention is represented in FIGS. 10a and 10b, which show the plot (10a) of the programming voltage applied to the gate terminal of a memory cell with an increment between adjacent programming steps that assumes two possible values, and the plot (10b) of the corresponding programmed threshold voltage. In this example there appear the staircase programming voltages with 200-mV (phase F1) and 50-mV (phase F2) increments between adjacent steps, which indicatively are able to provide the necessary programming precision for 2-bit-per-cell and 4-bit-per-cell storage. The temporal duration of a single program and verify step is 2 $\mu$s.

Programming with varying increments speeds up programming of the individual multilevel cell; for example, it is possible to obtain programming with the precision necessary for 16 levels in the same time that is required for 4 levels with fixed voltage increments.

To program a cell, the procedure starts with fast programming (F1) until the threshold voltage, controlled in the verify steps, reaches a value close to the one desired ($V_{TR1}$), and then proceeds with fine programming (F2) until the desired value is reached.

During reading, an appropriate electric quantity (voltage or current) is extracted from the multilevel memory cell and compared with a set of reference values in order to reconstruct the information content of the memory cell in terms of binary information.

During each verify step generally a complete reading of the memory cell is not performed, but simply the electric quantity extracted is compared with a single reference value, which depends upon the threshold voltage value at which the memory cell is to be programmed. To carry out this operation, one of the comparators used for reading can be utilized.

In the program and verify technique with varying incremental steps according to the present invention, the comparator used for the verification compares the value of the electric quantity extracted from the memory cell, which is linked to the threshold voltage reached, with:

a preliminary reference, appropriately chosen lower than the target value, during fast programming; and the final reference, once there has been the transition to fine programming.

In order to optimize programming speed and precision, it is possible to apply programming voltages with staircase pulse amplitude also with voltage increments between adjacent programming steps that can be selected from among more than two different values, passing from the large step of fast programming to the smaller step of fine programming through a series of intermediate values, as described previously for the third programming method according to the present invention.

For generating a staircase voltage with varying increments between adjacent steps, a possible circuit implementation can be based upon the switched-capacitor circuit proposed in the U.S. Pat. No. 5,949,666, "Staircase Adaptive Voltage Generator Circuit" and represented for completeness of description in FIG. 11, where the control signal CNT selects the amplitude of the step, and the two phases $\Phi_1$ and $\Phi_2$ are not superimposed.

In this circuit, the two possible increments between adjacent values are:

$$\begin{cases} \Delta V_{G1} = \dfrac{C_A + C_B}{C_F}(V_{init} - V_{ref}) \text{ fast programming} \\ \Delta V_{G2} = \dfrac{C_B}{C_F}(V_{init} - V_{ref}) \text{ fine programming} \end{cases} \quad (9)$$

according to whether the control signal CNT is active or not.

To obtain an increment of amplitude selectable from among more than two values, it is possible to connect selectively more than one capacitor in parallel to $C_B$.

Two possible alternatives to obtain the incremental variation in the programming voltage consist in connecting an additional capacitor in parallel to $C_F$ instead of to $C_B$ or in varying one of the two reference voltages $V_{init}$ or $V_{ref}$.

Another possible circuit diagram for implementing a circuit generating a staircase voltage with digitally selectable increments is described in the Italian patent applications TO99A000993 "Voltage Generator Switchable Between First and Second Voltage Values Alternate To One Another, In Particular For Programming Multilevel Cells," and TO99A000994 "Programmable Voltage Generator, in Particular For Programming Multilevel Nonvolatile Memory Cells," where two or more alternatively selectable resistors having appropriate values are used.

The complete circuit for generating the programming voltage is formed by a staircase generator block (of the type of the ones referred to above) and possibly by an amplifier, connected in unit-gain configuration, which is capable of fast driving of the parasitic capacitance associated to the array row driving stage, as represented in FIG. 12.

For high-performance multilevel memories it is possible to implement a compact staircase generating circuit, for example based upon a switched-capacitor block, with the function of programming a memory cell, alongside each voltage read circuit, an arrangement which is perfectly integratable in hierarchical decoding with digital row selection (for example, of the type described in the Italian patent application MI00A001585 "Hierarchical decoding with digital row selection for nonvolatile memory devices").

In this way, a programming parallelism can be obtained that is the same as the reading parallelism, together with the maximum versatility in the management of the programming procedure.

Finally, it is clear that modifications and variations can be made to the programming methods described and illustrated herein, without thereby departing from the sphere of protection of the present invention, as defined in the attached claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method for programming a memory cell, comprising:
   applying to a control terminal of said memory cell a first programming pulse train with pulse amplitude increasing in staircase fashion; and
   applying to the control terminal of said memory cell a second programming pulse train with pulse amplitude increasing in staircase fashion, in which an amplitude increment between one pulse and the next in said first programming pulse train is is greater than an amplitude increment between one pulse and the next in said second programming pulse train, wherein a transition from said first programming pulse train to said second programming pulse train is made when said memory cell has a threshold voltage having a first pre-set relation with a first reference value.

2. The programming method according to claim 1, wherein said first pre-set relation is defined by the condition that the threshold voltage of said memory cell exceeds said first reference value.

3. The programming method according to claim 1, wherein said first reference value is correlated to the threshold voltage at which said memory cell is to be programmed.

4. The programming method according to claim 3, wherein said first reference value is lower than the threshold voltage) at which said memory cell is to be programmed.

5. The programming method according to claim 1, further comprising applying, to said control terminal of said memory cell and before said first programming pulse train, a third programming pulse train with pulse amplitude increasing in staircase fashion.

6. The programming method according to claim 5, wherein the amplitude increment between one pulse and the next in said third programming pulse train is substantially equal to the amplitude increment between one pulse and the next in said second programming pulse train.

7. The programming method according to claim 5, wherein the amplitude increment between one pulse and the next in said third programming pulse train is greater than the amplitude increment between one pulse and the next in said first programming pulse train.

8. The programming method according to claim 5, wherein a transition from said third programming pulse train to said first programming pulse train is made when said memory cell presents a threshold voltage having a second pre-set relation with a second reference value.

9. The programming method according to claim 8, wherein said second pre-set relation is defined by the condition that the threshold voltage of said memory cell exceeds said second reference value.

10. The programming method according to claim 5, wherein a transition from said third programming pulse train to said first programming pulse train is made after a pre-set number of programming pulses.

11. A method for programming a memory cell, comprising:
    applying to a control terminal of said memory cell a first programming pulse train with pulse amplitude increasing in staircase fashion; and
    applying to the control terminal of said memory cell a second programming pulse train with pulse amplitude increasing in staircase fashion, in which an amplitude increment between one pulse and the next in said first programming pulse train is greater than an amplitude increment between one pulse and the next in said second programming pulse train;
    applying, to said control terminal of said memory cell and before said first programming pulse train, a third programming pulse train with pulse amplitude increasing in staircase fashion, the amplitude increment between one pulse and the next in said third programming pulse train being less than the amplitude increment between one pulse and the next in said first programming pulse train.

12. A method for programming a memory cell, comprising:
    applying to a control terminal of said memory cell a first programming pulse train with pulse amplitude increasing in staircase fashion;
    applying to the control terminal of said memory cell a second programming pulse train with pulse amplitude increasing in staircase fashion, in which an amplitude increment between one pulse and the next in said first programming pulse train is greater than an amplitude increment between one-pulse and the next in said second programming pulse train; and
    applying, to a first terminal of said memory cell and simultaneously with each one of said programming pulse trains applied to said control terminal, a respective programming pulse trains with constant pulse amplitude.

13. The programming method according to claim 12, wherein said programming pulse trains applied to said first terminal of said memory cell have pulse amplitudes substantially equal to one another.

14. A method for programming a memory cell, comprising:
    applying to a control terminal of the memory cell a first train of pulses, each pulse of the first train having an amplitude increasing by a first step value over an amplitude of the preceding pulse;
    applying to the control terminal of the memory cell a second train of pulses, each pulse of the second train having an amplitude increasing by a second step value over an amplitude of the preceding pulse;
    measuring a threshold voltage of the memory cell; and
    transitioning from the first train of pulses to the second train of pulses when the threshold voltage exceeds a first threshold value.

15. The method of claim 14 wherein the transitioning step includes applying to the control terminal of the memory cell a series of pulses, the amplitude of each pulse of the series increasing over the amplitude of the preceeding pulse by a step value that varies incrementally with each pulse until the second step value is achieved.

16. The method of claim 14 wherein the first threshold value has a selected relation to a reference voltage.

17. The method of claim 14, further comprising ending the second train of pulses when the threshold voltage exceeds a second threshold value.

18. The method of claim 14 wherein the first step value is greater than the second step value.

19. The method of claim 14, further comprising applying to the control terminal of the memory cell a third train of pulses, each pulse of the third train having an amplitude increasing by a third step value over an amplitude of a preceeding pulse.

20. The method of claim 19, further comprising transitioning from the second train of pulses to the third train of pulses when the threshold voltage exceeds a first threshold value.

21. The method of claim 20 wherein the transitioning step includes applying to the control terminal of the memory cell a series of pulses, the amplitude of each pulse of the series increasing over the amplitude of the preceeding pulse by a step value that varies incrementally with each pulse until the third step value is achieved.

22. The method of claim 20 wherein the first threshold value has a selected relation to a reference voltage.

23. The method of claim 20, further comprising ending the third train of pulses when the threshold voltage exceeds a second threshold value.

24. The method of claim 19 wherein the second step value is greater than the first step value.

25. The method of claim 19 wherein the second step value is greater than the third step value.

26. A method for programming a memory cell, comprising:

applying to a control terminal of the memory cell a first train of pulses, each pulse of the first train having an amplitude increasing by a first step value over an amplitude of the preceding pulse;

applying to the control terminal of the memory cell a second train of pulses, each pulse of the second train having an amplitude increasing by a second step value over an amplitude of the preceding pulse; and measuring a threshold voltage of the memory cell.

27. The method of claim 26, further comprising transitioning from the first train of pulses to the second train of pulses after a selected number of pulses in the first train.

28. The method of claim 27 wherein the transitioning step includes applying to the control terminal of the memory cell a series of pulses, the amplitude of each pulse of the series increasing over the amplitude of the preceeding pulse by a step value that varies incrementally with each pulse until the second step value is achieved.

29. A memory device, comprising:

a memory cell;

means for applying to a control terminal of the memory cell a first train of pulses, each pulse of the first train having an amplitude increasing by a first step value over an amplitude of the preceding pulse;

means for applying to the control terminal of the memory cell a second train of pulses, each pulse of the second train having an amplitude increasing by a second step value over an amplitude of the preceding pulse;

means for measuring a threshold voltage of the memory cell; and means for transitioning from the first train of pulses to the second train of pulses when the threshold voltage exceeds a first threshold value.

30. The device of claim 29 wherein the transitioning means includes means for applying to the control terminal of the memory cell a series of pulses, the amplitude of each pulse of the series increasing over the amplitude of the preceeding pulse by a step value that varies incrementally with each pulse until the second step value is achieved.

31. The device of claim 29 wherein the first threshold value has a selected relation to a reference voltage.

32. The device of claim 29, further comprising means for ending the second train of pulses when the threshold voltage exceeds a second threshold value.

33. The device of claim 29 wherein the first step value is greater than the second step value.

* * * * *